United States Patent
Lin

(10) Patent No.: US 7,791,883 B2
(45) Date of Patent: Sep. 7, 2010

(54) FASTENING HEAT EXCHANGER APPARATUS

(75) Inventor: Ian Lin, Taipei (TW)

(73) Assignee: International Business Machines Corporation, Armonk, NY (US)

( * ) Notice: Subject to any disclaimer, the term of this patent is extended or adjusted under 35 U.S.C. 154(b) by 177 days.

(21) Appl. No.: 11/538,528

(22) Filed: Oct. 4, 2006

(65) Prior Publication Data

US 2007/0115639 A1    May 24, 2007

(30) Foreign Application Priority Data

Nov. 18, 2005   (TW) ............................... 94140531 A

(51) Int. Cl.
*H05K 7/20* (2006.01)
*F28F 7/00* (2006.01)
*H01L 23/34* (2006.01)

(52) U.S. Cl. ............. 361/700; 361/679.47; 361/679.52; 165/80.4; 165/80.5; 165/104.33; 174/15.2; 257/714

(58) Field of Classification Search ................ 361/699, 361/700, 696, 718–719, 701; 257/714–715, 257/718–719; 174/15.2, 252; 165/80.4, 165/80.5, 104.33

See application file for complete search history.

(56) References Cited

U.S. PATENT DOCUMENTS

| | | | |
|---|---|---|---|
| 5,898,571 A * | 4/1999 | Mertol | 361/704 |
| 6,008,989 A * | 12/1999 | Lee et al. | 361/704 |
| 6,233,146 B1 | 5/2001 | Gilchrist et al. | |
| 6,269,001 B1 * | 7/2001 | Matteson et al. | 361/695 |
| 6,560,111 B1 * | 5/2003 | Lo | 361/719 |
| 6,564,859 B2 | 5/2003 | Reisfeld | |
| 6,643,133 B1 * | 11/2003 | Liu | 361/704 |
| 6,768,641 B2 * | 7/2004 | Li | 361/719 |
| 6,822,863 B1 | 11/2004 | Artman et al. | |
| 6,903,930 B2 | 6/2005 | DiStefano et al. | |
| 6,934,153 B2 * | 8/2005 | Lee et al. | 361/697 |
| 6,961,243 B2 * | 11/2005 | Shih-Tsung | 361/700 |
| 7,254,023 B2 * | 8/2007 | Lu et al. | 361/698 |
| 2004/0223302 A1 | 11/2004 | Pokharna | |
| 2005/0103480 A1 | 5/2005 | Pokharna et al. | |
| 2005/0111196 A1 * | 5/2005 | Wang et al. | 361/719 |

FOREIGN PATENT DOCUMENTS

JP        2002168584 A      6/2002

* cited by examiner

*Primary Examiner*—Zachary M Pape
(74) *Attorney, Agent, or Firm*—Dillon & Yudell LLP

(57) ABSTRACT

A heat exchanger is connected with a heat source in order to dissipate heat generated by the heat source. The fastening apparatus includes a first bracket and a second bracket, both connected to the base, and a first latch element. There is a first opening formed in the first bracket. The first latch element is connected to one side of the heat exchanger, and includes a first protrusion and a first contact section. The first protrusion penetrates through the first opening making the first bracket provide movement limitation to the heat exchanger. The second bracket provides additional movement limitation to the heat exchanger. To separate the heat exchanger from the base, the first contact section is pressed to make the first protrusion move out of the first opening.

19 Claims, 4 Drawing Sheets

FASTENING HEAT EXCHANGER APPARATUS

CROSS REFERENCE TO RELATED APPLICATIONS

This application claims priority to Taiwan Patent Application No. 94140531 entitled "METHOD AND APPARATUS FOR FASTENING HEAT EXCHANGER", filed on Nov. 18, 2005, which is incorporated herein by reference and assigned to the assignee herein.

FIELD OF INVENTION

The present invention generally relates to a fastening apparatus and a method using the same, and more particularly, to a fastening apparatus for fastening a heat exchanger on a base and the method using the same.

BACKGROUND OF THE INVENTION

While in operation, the central processing unit (CPU) of a computer generates a certain amount of heat. Without dissipating the heat efficiently, the efficacy of the CPU will deteriorate dramatically and the CPU may even become malfunctioned. Therefore, a heat dissipation system plays an important role during normal operation of a CPU.

Among the heat dissipation systems, there are designs that use heat-sinks with heat-pipes to dissipate the generated heat. These types of design are called Remote Heat Exchanger, RHE. In these designs, the heat exchanger is placed externally to enhance the efficiency of dissipation. If the external heat exchanger is not fastened properly during assembling process, components or system damage will be resulted during transportation or testing stage which results in extra costs.

SUMMARY OF THE INVENTION

The present invention provides a fastening apparatus for fastening a heat exchanger on a base and the method using the same. The method provides herein can be accomplished in a tool-less manner. The heat exchanger is connected with a heat source for dissipating heat generated by the heat source through the heat exchanger.

According to an embodiment of the present invention, the fastening apparatus includes a first bracket connected to the base, a first latch element, and a second bracket connected to the base. There is a first opening formed in the first bracket. The first latch element is connected to one side of the heat exchanger and includes a first protrusion and a first contact section for facilitating a user to operate the first latch element. The first protrusion penetrates through the first opening making the first bracket provide movement limitation to the heat exchanger. The second bracket connected with the heat exchanger provides additional movement limitation to the heat exchanger while there is no relative motion between the heat exchanger and the base in the meanwhile. When a user wants to separate the heat exchanger from the base, he presses the first contact section to make the first protrusion move out of the first opening allowing the heat exchanger to be separated from the base.

The method for fastening a heat exchanger on a base is used by employing the fastening apparatus. The heat exchanger is connected with a heat source for dissipating heat generated by the heat source through the heat exchanger. The fastening apparatus includes a first bracket, a first latch element, and a second bracket. There is a first opening formed in the first bracket. The first latch element is connected to one side of the heat exchanger and further includes a first protrusion and a first contact section. The second bracket is connected with the heat exchanger. The fastening/releasing method comprises steps of:

(a) disposing the heat exchanger on the base rendering the first protrusion penetrate through the first opening making first bracket provide movement limitation to the heat exchange, and the second bracket connected with the heat exchanger providing additional movement limitation to the heat exchanger while there is no relative motion between the heat exchanger and the base in the meanwhile; and (b) pressing the first contact section making the first protrusion move out of the first opening allowing the heat exchanger to be separated from the base.

DETAILED DESCRIPTION OF THE INVENTION

Figure 1A:
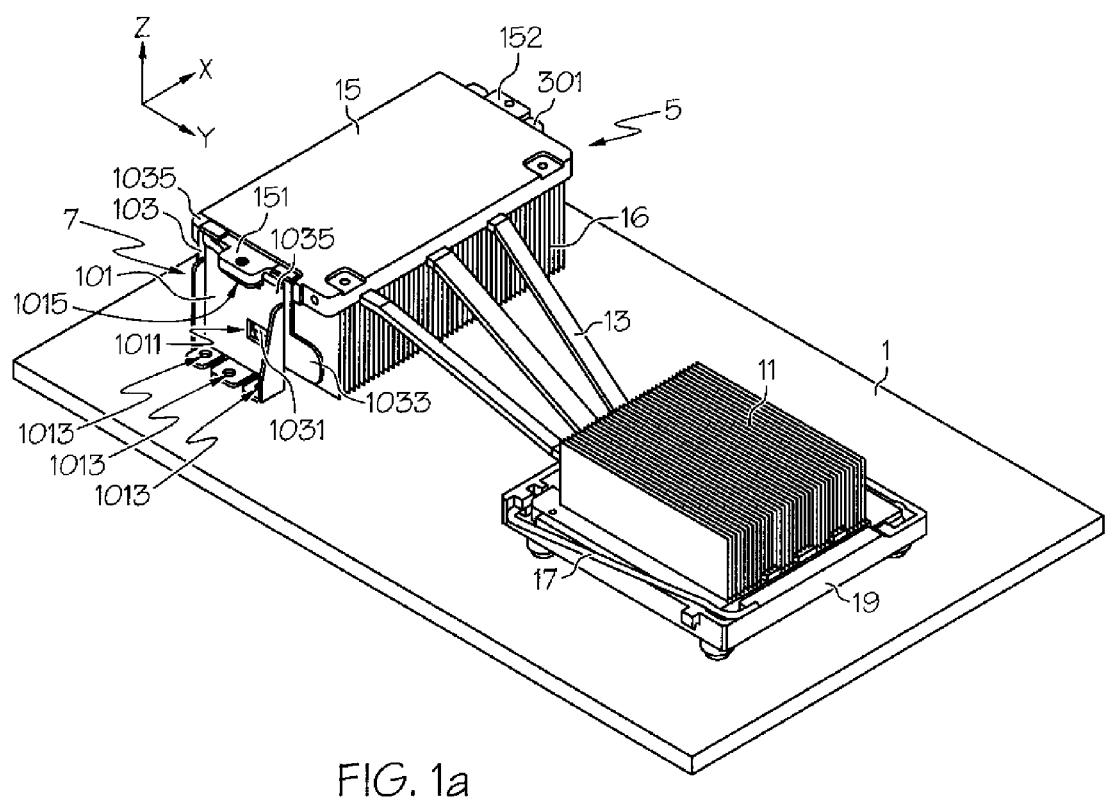
FIG. 1a is a schematic diagram of an embodiment of the present invention.
Figure 1B:
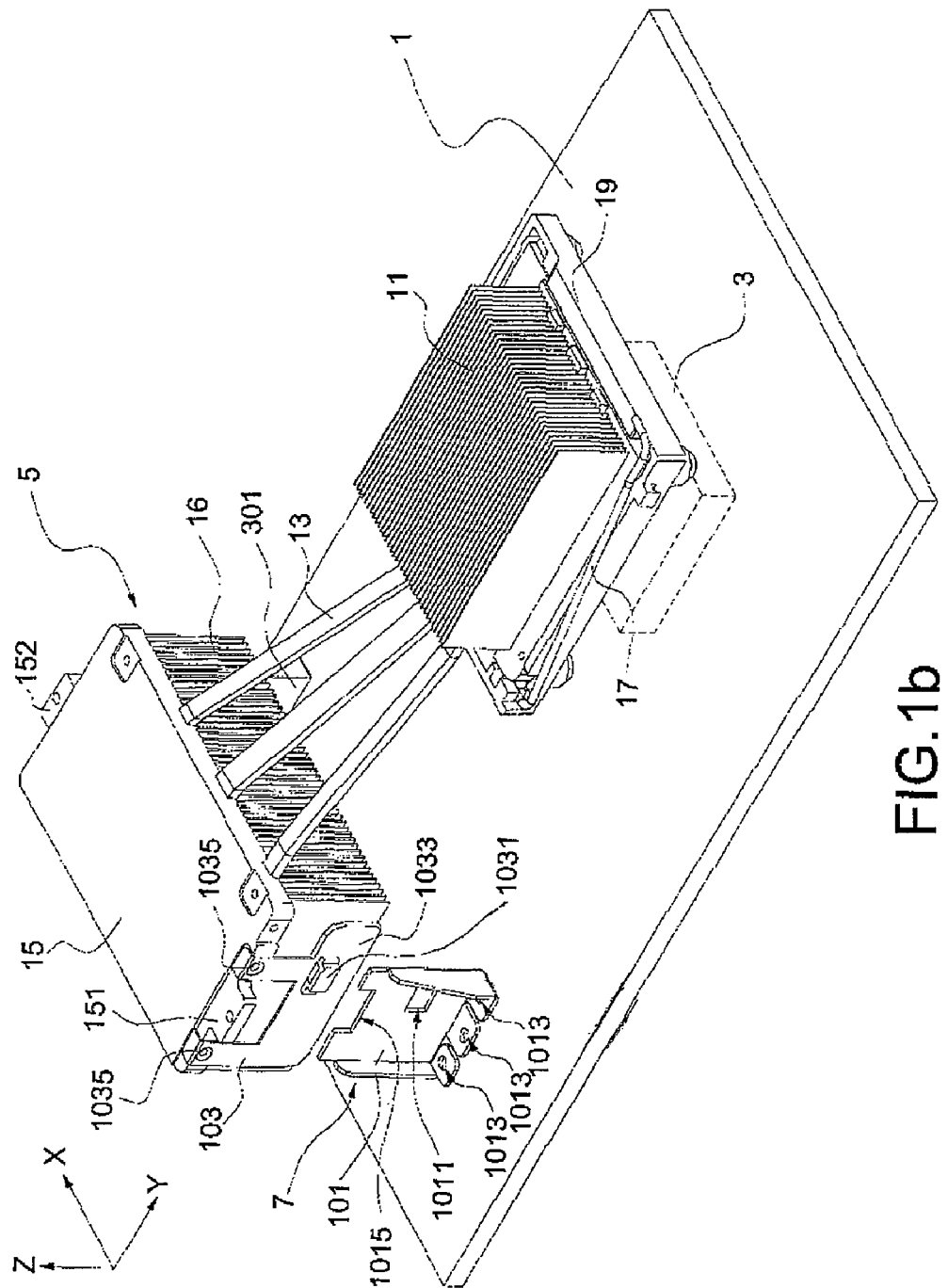
FIG. 1b is a schematic diagram of another embodiment of the present invention, wherein the bracket is separated from the latch element.

FIGS. 1a & 1b are a schematic diagram of an embodiment of the present invention. Brief description of a heat exchanging apparatus used in the embodiment is first given here. The heat exchanging apparatus includes a first heat exchanger 11, a heat conducting device 13, and a second heat exchanger 5, in which the second heat exchanger 5 further includes heat-sinks 16 and a heat-conducting plate 15. A frame 19 is fastened upon a heat source 3, such as a CPU. When the first heat exchanger 11 is pivotally rotated into the frame 19, pressing down a shaft 17 fastens the first heat exchanger 11 on the frame 19 and such that the first heat exchanger 11 is adjacent to the heat source 3 to dissipate the heat. When the shaft 17 is lifted up, the first heat exchanger 11 is released from the frame 19 making the first heat exchanger 11 to be away from the heat source 3. In addition, the frame 19 is connected to the heat conducting device 13 to conduct the generated heat to the conducting plate 15 which is able to conduct the heat to the heat-sinks uniformly, and afterwards the heat is dissipated through the heat-sinks 16.

As shown in FIG. 1a, the present embodiment illustrates a fastening apparatus 7 for fastening the second heat exchanger 5 on a base 1. The fastening apparatus 7 includes a first bracket 101 connected with the base 1 by using a screw nut 1013 underneath, a first latch element 103, and a second bracket 301, which is located at the other side of the heat exchanger 5 corresponding to the first bracket 101, connected with the base 1. There is a first opening 1011 formed in the first bracket 101. The first latch 103 is connected to one side of the heat-conducting plate 15 (same side as the first bracket 101), and the first latch element 103 includes a first protrusion 1031 and a first contact section 1033. The first protrusion 1031 penetrates the first opening 1011 ensuring there is no relative motion between the first latch element 103 and the first bracket 101, and by which provides movement limitation to the heat exchanger 5 on the base 1 along Y and Z directions. The second bracket 301 and the first bracket 101 together provide movement limitation to the heat exchanger 5 along X direction. The first contact section 1033 is provided to separate the first latch element 103 from the first bracket 101. A third protrusion 151 and a fourth protrusion 152 are provided at different sides of the heat-conducting plate 15 respectively corresponding to a first depression 1015 of the first bracket 101 and a second depression 3015 of the second bracket 301 (referring to FIG. 3) for providing additional movement limitation along Y and Z directions. It should be noted that, in other embodiments, the additional third protrusion 151 and fourth protrusion 152, and the depressions 1015 and 3015 are optional. Sufficient movement limitation along Y and Z directions can still be achieved by means of the first protrusion 1031 and the first opening 1011.

As illustrated in FIG. 1*a*, there is no relative motion between the heat exchanger 5 and the base 1 (the heat exchanger 5 is fastened along all X, Y, and Z directions by the fastening apparatus 7). Referring to FIG. 1*b*, when a user wants to separate the heat exchanger 5 from the base 1, he only needs to press the first contact section 1033 (a space is reserved while connecting the first latch element 103 to the heat conducting plate 15) making the first protrusion 1031 move out of the first opening 1011. Therefore, the movement of the heat exchanger 5 is not limited along Y and Z directions anymore. Therefore the user can separate the heat exchanger 5 from the base 1 and retrieve the heat exchanger 5 easily. If the user would like to fasten the heat exchanger 5 on the base 1 again, he has to place the heat exchanger 5 at the original fastening position and makes the first protrusion 1031 penetrate the first opening 1011. The size and shape of the first protrusion 1031 and the first opening 1011 are determined by the user's tolerance for the fastening inaccuracy. For example, if there is a gap between the boundary of the first protrusion 1031 and the first opening 1011, the size of the gap is the range of the movement tolerance for the heat exchanger 5. For the user, fastening and releasing the heat exchanger 5 of the present invention in a tool-less manner is quite convenient.

As shown in FIG. 1*a* and FIG. 1*b*, the first latch element 103 and the heat-conducting plate 15 are locked together with a screw 1035 to secure the connection between the two.

Figure 2:
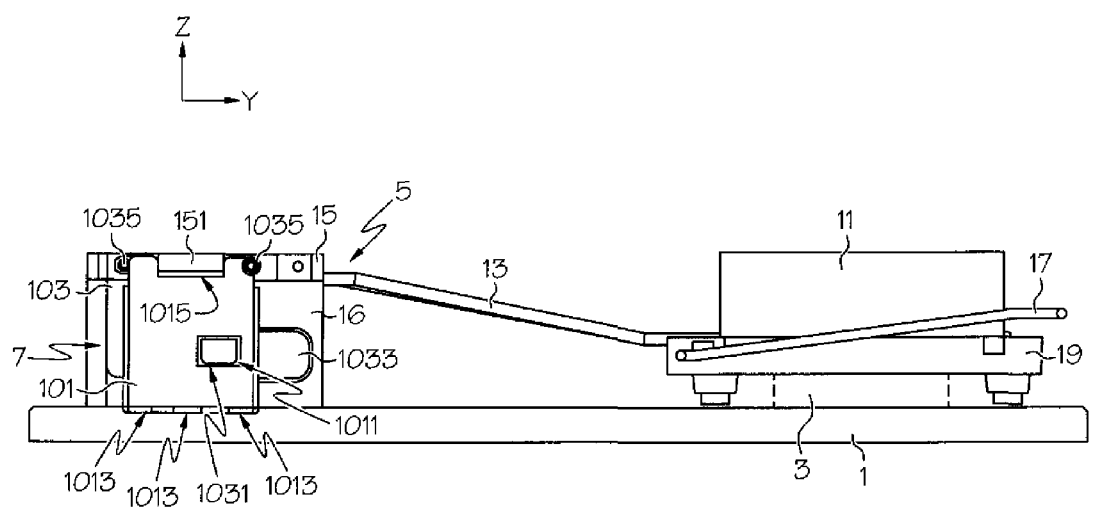
FIG. 2 is a side view of an embodiment of the present invention.

FIG. 2 is a side view of an embodiment of the present invention. From the side view shown in FIG. 2, a better understanding of the relative position of each element of the fastening apparatus 7 can be achieved.

Figure 3:
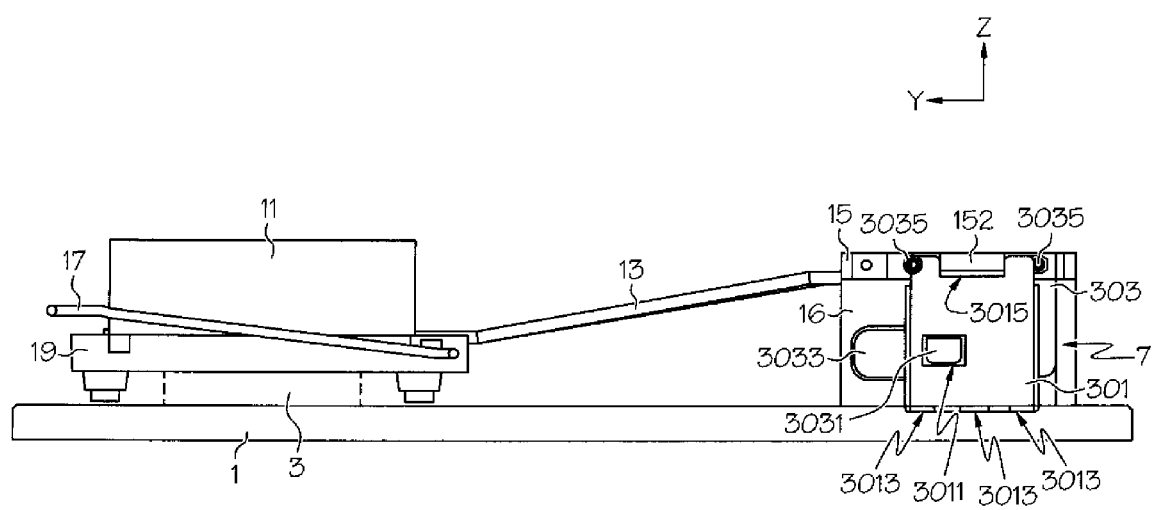
FIG. 3 is a side view of another embodiment of the present invention.

FIG. 3 is a side view of another embodiment of the present invention. Different from the embodiment shown in FIG. 1, there is a second latch element 303 disposed at a side of the second bracket 301 of the present invention for facilitating a user to operate the present invention. As shown in FIG. 3, the fastening apparatus 7 of the present embodiment includes the first bracket 101 connected with the base 1 by using the screw nut 1013 underneath, the first latch element 103, the second latch element 303, and the second bracket 301, which is located at the other side of the heat exchanger 5 corresponding to the first bracket 101, connected with the base 1. There is the first opening 1011 formed in the first bracket 101, and there is a second opening 3011 formed in the second bracket 301. The first latch element 103 is connected to one side of the heat exchanger 5 (the same side as the first bracket 101), and the second latch element 303 is connected to the other side of the heat exchanger 5 (the same side as the second bracket 301). The first latch element 103 includes the first protrusion 1031 and the first contact section 1033. The first protrusion 1031 penetrates through the first opening 1011 ensuring that there is no relative motion between the first latch element 103 and the first bracket 101, and by which provides movement limitation to the heat exchanger 5 on the base 1 along both Y and Z directions. The second latch element 303 includes a second protrusion 3031 and a second contact section 3033. The second protrusion 3031 penetrates through the second opening 3011 ensuring that there is no relative motion between the second latch element 303 and the second bracket 301, and by which provides movement limitation to the heat exchanger 5 on the base 1 along both Y and Z directions. The first contact section 1033 and the second contact section 3033 facilitate the user to operate the first latch element 103 and the second latch element 303 after the two elements being released from the first bracket 101 and the second bracket 301 respectively. There are a third protrusion 151 and a fourth protrusion 152 disposed on the both sides of the heat-conducting plate 15 corresponding to the first depression 1015 on the first bracket 101 and the second depression 3015 on the second bracket 301 for providing additional movement limitation to the heat exchanger 5 along the Y and Z directions. It should be noted that, in other embodiments, the additional third protrusion 151 and fourth protrusion 152, and the depressions 1015 and 3015 are optional. Sufficient movement limitation along Y and Z directions can still be achieved by means of the first protrusion 1031, the first opening 1011, the second protrusion 3031 and the second opening 3011.

The second bracket 301 and the first bracket 101 together provide movement limitation to the heat exchanger 5 along X direction. As illustrated in FIG. 3, there is no relative motion between the heat exchanger 5 and the base 1 at this moment (the heat exchanger 5 is fastened by the fastening apparatus 7 along all X, Y, and Z directions). When the user wants to separate the heat exchanger 5 from the base 1, he only needs to press the first contact section 1033 (a space is reserved while connecting the first latch element 103 to the heat conducting plate 15) and the second contact section 3033 making the first protrusion 1031 and the second protrusion 3031 move out of the first opening 1011 and the second opening 3011 respectively. In the moment, the movement of the heat exchanger 5 is not limited along the Y and Z directions, and the user can separate the heat exchanger 5 from the base 1 and retrieve the heat exchanger 5 easily. If the user would like to fasten the heat exchanger 5 on the base 1 again, he has to place the heat exchanger 5 at the original fastening position and makes the first protrusion 1031 and the second protrusion 3031 penetrate the first opening 1011 and the second opening 3011, respectively. The size and shape of the first protrusion 1031 and the first opening 1011 are determined by the user's tolerance for the fastening inaccuracy (the same applied to the second protrusion 3031 and the second opening 3011). For example, if there is a gap between the outer boundary of the first protrusion 1031 and the first opening 1011, the size of the gap is the range of the movement tolerance for the heat exchanger 5. In the present embodiment, the latch elements are mounted at both sides of the heat exchanger 5 so that a more stable fixation is provided. For the user, fastening and releasing the heat exchanger 5 of the present invention in a tool-less manner is quite convenient.

As shown in FIG. 3, the second latch element 303 and the heat-conducting plate 15 are locked together with a screw 3035 to secure the connection between the two.

In other embodiments of the present invention, the first latch element 103 is a leaf spring and the base 1 is a computer housing. The heat exchanger 5 dissipates heat generated by the CPU of a computer. The heat conducting device 13 is a heat pipe and the first heat exchanger 11 and the heat-sinks 16 may be fin-like.

A method for fastening/releasing the heat exchanger 5 from the base 1 is also provided in conjunction with the above-mentioned fastening apparatus 7. Take the fastening apparatus 7 described in the FIG. 2 as an example to illustrate the fastening method of the present invention. The fastening method includes (a) disposing the heat exchanger 5 on the base 1 rendering the first protrusion 1031 penetrate the first opening 1011 making the first bracket 101 provide movement limitation to the heat exchanger 5; (b) pressing the first contact section 1033 making the first protrusion 1031 move out of the first opening 1011 allowing the heat exchanger 5 to be separated from the base 1.

Take the described fastening apparatus 7 of the embodiment in FIG. 3 as another example to illustrate the fastening/releasing method of the present invention. The fastening/releasing method includes (a) disposing the heat exchanger 5 on the base 1 rendering the first protrusion 1031 penetrate the first opening 1011 and the second protrusion 3031 penetrate the second opening 3011 making the first bracket 101 and the second bracket 301 provide movement limitation to the heat exchanger 5; (b) pressing the first contact section 1033 and the second contact section 3033 making the first protrusion 1031 and the second contact section 3033 move out of the first opening 1011 and the second opening 3011 respectively allowing the heat exchanger 5 to be separated from the base 1.

The illustration of the embodiment of the present invention is given above for a better understanding of the characteristics and spirit of the present invention. It will be understood that the invention is not limited to the particular embodiment described herein, but is capable of various modifications and rearrangements without departing from the scope of the invention. Therefore, it is intended that the following claims, accompanied by detailed descriptions giving the broadest explanation, not only define the scope of the present invention but also cover all such modifications and changes as fall within the true spirit and scope of the present invention.

What is claimed is:

1. A fastening apparatus for fastening a secondary heat exchanger on a base, said fastening apparatus comprising:
    a first bracket, connected to said base, including a first opening;
    a first latch element attached to one side of said secondary heat exchanger for securing said secondary heat exchanger to said base, wherein said first latch element is physically affixed to the secondary heat exchanger and comprises:
        a first protrusion, wherein said first protrusion provides a complimentary shape to said first opening, wherein the complimentary shape of said first protrusion firmly secures within the space provided by said first opening, wholly filling said first opening;
        a first contact section for facilitating operation of said first latch element; and
        wherein, said first protrusion penetrates through said first opening preventing movement of said first bracket with said secondary heat exchanger and preventing movement of the secondary heat exchanger, and as said first contact section is pressed inward, said first protrusion is automatically disengaged from said first opening allowing said secondary heat exchanger to be separated from said base;
    wherein said secondary heat exchanger is distant from the heat source and connected with the heat source via a heat conducting device providing physical separation between the secondary heat exchanger and the heat source, and wherein the heat source is directly adjacent to a primary heat exchanger;
    wherein the heat conducting device is connected to a first frame to which the heat source and the primary heat exchanger are attached; and
    a second frame to which the first latch element is attached;
    wherein the second frame is directly connected to the heat conducting device to conduct the heat transferred via the heat conducting device from the heat source.

2. The fastening apparatus of claim 1, wherein said first latch element and said secondary heat exchanger are locked together with a screw.

3. The fastening apparatus of claim 1, wherein said base is a base of a computer housing.

4. The fastening apparatus of claim 1, wherein said heat source is a central processing unit (CPU).

5. The fastening apparatus of claim 1, wherein the primary heat exchanger and the secondary heat exchanger are spatially distant, and wherein the heat generated by said heat source is dissipated by the primary heat exchanger and is also dissipated by the secondary heat exchanger via the heat conducting device connecting the secondary heat exchanger to the frame on which the heat source and the primary heat exchanger are fastened.

6. The fastening apparatus of claim 1, wherein said secondary heat exchanger includes:
    a plurality of fin-like heat-sinks attached to the second frame.

7. The fastening apparatus of claim 1, wherein said secondary heat exchanger comprises a third protrusion and said first bracket defines a first depression, said third protrusion engages with said first depression for providing additional movement limitation to said secondary heat exchanger.

8. The fastening apparatus of claim 1, further comprising a second bracket connected to said base and in touch with said secondary heat exchanger via a second latch element that is physically affixed to the secondary heat exchanger for providing additional movement limitation to said secondary heat exchanger.

9. The fastening apparatus of claim 8, wherein said secondary heat exchanger comprises a fourth protrusion and said second bracket defines a second depression, wherein further said fourth protrusion engages with said second depression for providing additional movement limitation to said secondary heat exchanger.

10. A fastening apparatus for fastening a secondary heat exchanger on a base, and said fastening apparatus comprising:
    a first bracket, connected to said base, including a first opening;
    a heat conducting device, wherein the heat conducting device interconnects the secondary heat exchanger and a heat source and conducts heat to the secondary heat exchanger uniformly, wherein the secondary heat exchanger is distant from a primary heat exchanger that also conducts heat away from the heat source;
    wherein further said secondary heat exchanger is distant from the heat source, and wherein the heat source is directly adjacent to the primary heat exchanger;
    a first latch element attached to one side of said secondary heat exchanger for securing said secondary heat exchanger to said base, wherein said first latch element is physically affixed to the secondary heat exchanger and comprises:
        a first protrusion, wherein said first protrusion provides a complimentary shape to said first opening, wherein the complimentary shape of said first protrusion firmly secures within the space provided by said first opening, wholly filling said first opening;
        and a first contact section for facilitating operation of said first latch element;

a second bracket, connected to said base, including a second opening;

a second latch element connected to another side of said secondary heat exchanger, and said second latch element comprising:
   a second protrusion; and
   a second contact section for facilitating operation of said second latch element; and wherein, said first protrusion penetrates through said first opening and said second protrusion penetrates through said second opening preventing movement of said first bracket and said second bracket with said heat exchanger and preventing movement of the heat exchanger, and as said first contact section and said second contact section are pressed inward simultaneously, said first protrusion and said second protrusion are automatically disengaged from said first opening and said second opening, respectively, allowing said secondary heat exchanger to be separated from said base;

wherein the heat conducting device is connected to a first frame to which the heat source and the primary heat exchanger are attached;

a second frame to which the first latch element is attached;

wherein the second frame is directly connected to the heat conducting device to conduct the heat transferred via the heat conducting device from the heat source.

11. The fastening apparatus of claim 10, wherein said base is a base of a computer housing.

12. The fastening apparatus of claim 10, wherein said heat source is a CPU.

13. The fastening apparatus of claim 10, wherein said secondary heat exchanger includes:
   a plurality of fin-like heat-sinks that are attached to the second frame.

14. The fastening apparatus of claim 10, wherein said secondary heat exchanger comprises a third protrusion and said first bracket defines a first depression, said third protrusion engages with said first depression for providing additional movement limitation to said secondary heat exchanger.

15. The fastening apparatus of claim 14, wherein said secondary heat exchanger comprises a fourth protrusion and said second bracket defines a second depression, wherein further said fourth protrusion engages with said second depression for providing additional movement limitation to said secondary heat exchanger.

16. A fastening/releasing method using a fastening apparatus for fastening a secondary heat exchanger on a base and releasing said secondary heat exchanger from said base, wherein:
   said secondary heat exchanger being distant from a heat source;
   only a primary heat exchanger from among the secondary heat exchanger and the primary heat exchanger is directly adjacent to the heat source by being fastened to a frame to which the heat source is also fastened;
   a heat conducting device interconnects the secondary heat exchanger and the frame to which the primary heat exchanger is fastened, wherein the heat conducting device uniformly conducts heat to the secondary heat exchanger; and said fastening apparatus having a first bracket and a first latch element, said first bracket connected to said base including a first opening, said first latch element being attached to one side of said heat exchanger for securing said heat exchanger to said base, and said first latch element being physically affixed to the secondary heat exchanger and further comprising a first protrusion and a first contact section, wherein said first protrusion provides a complimentary shape to said first opening, wherein the complimentary shape of said first protrusion firmly secures within the space provided by said first opening, wholly filling said first opening;

wherein the heat conducting device is connected to the frame to which the heat source and the primary heat exchanger are attached;

wherein the secondary heat exchanger includes a second frame to which the first latch element is attached; and wherein the second frame is directly connected to the heat conducting device to conduct the heat transferred via the heat conducting device from the heat source; and said method comprising:
   (a) fastening the secondary heat exchanger to the base by disposing said secondary heat exchanger on said base by inserting said first protrusion to penetrate through said first opening preventing movement of said first bracket relative to said secondary heat exchanger and preventing movement of the secondary heat exchanger; and
   (b) releasing said secondary heat exchanger from the base by pressing said first contact section inward to automatically disengage said first protrusion from said first opening allowing said secondary heat exchanger to be separated from said base.

17. The method of claim 16, wherein said secondary heat exchanger includes:
   a plurality of fin-like heat-sinks that are attached to the second frame.

18. The method of claim 16, wherein said secondary heat exchanger comprises:
   a third protrusion and said first bracket defines a first depression, said third protrusion engages with said first depression for providing additional movement limitation to said secondary heat exchanger; and
   a fourth protrusion and a second bracket defining a second depression, wherein further said fourth protrusion engages with said second depression for providing additional movement limitation to said secondary heat exchanger.

19. The method of claim 16, wherein the primary heat exchanger and the secondary heat exchanger are spatially distant, and wherein the heat generated by said heat source is dissipated by the primary heat exchanger and is also dissipated by the secondary heat exchanger via the heat conducting device connecting the secondary heat exchanger to the frame on which the heat source and the primary heat exchanger are fastened.

* * * * *